(12) United States Patent
Lee et al.

(10) Patent No.: US 9,887,167 B1
(45) Date of Patent: Feb. 6, 2018

(54) EMBEDDED COMPONENT PACKAGE STRUCTURE AND METHOD OF MANUFACTURING THE SAME

(71) Applicant: Advanced Semiconductor Engineering, Inc., Kaohsiung (TW)

(72) Inventors: Chih Cheng Lee, Kaohsiung (TW); Hsing Kuo Tien, Kaohsiung (TW); Li Chuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/269,787

(22) Filed: Sep. 19, 2016

(51) Int. Cl.
| | |
|---|---|
| *H01L 23/34* | (2006.01) |
| *H01L 23/00* | (2006.01) |
| *H01L 23/538* | (2006.01) |
| *H01L 23/367* | (2006.01) |
| *H01L 21/48* | (2006.01) |

(52) U.S. Cl.
CPC .......... *H01L 23/562* (2013.01); *H01L 21/486* (2013.01); *H01L 21/4853* (2013.01); *H01L 21/4857* (2013.01); *H01L 21/4882* (2013.01); *H01L 23/3677* (2013.01); *H01L 23/5383* (2013.01); *H01L 23/5384* (2013.01); *H01L 23/5386* (2013.01); *H01L 23/5389* (2013.01)

(58) Field of Classification Search
CPC ............. H01L 23/5383; H01L 23/5384; H01L 23/5385; H01L 23/5386; H01L 23/5389
USPC .................................................. 257/713, 723
See application file for complete search history.

(56) References Cited

U.S. PATENT DOCUMENTS

| | | | | |
|---|---|---|---|---|
| 5,111,278 | A * | 5/1992 | Eichelberger | H01L 23/473 257/698 |
| 5,241,456 | A * | 8/1993 | Marcinkiewicz | H01L 23/5384 174/250 |
| 5,870,289 | A * | 2/1999 | Tokuda | H01L 21/6835 174/260 |
| 6,271,469 | B1 * | 8/2001 | Ma | H01L 21/56 174/521 |
| 6,335,565 | B1 * | 1/2002 | Miyamoto | H01L 23/49572 257/676 |
| 6,472,735 | B2 * | 10/2002 | Isaak | H01L 25/0657 257/685 |
| 6,709,897 | B2 | 3/2004 | Cheng et al. | |
| 7,989,944 | B2 | 8/2011 | Tuominen | |
| 8,368,201 | B2 | 2/2013 | Tuominen | |

(Continued)

*Primary Examiner* — Nitin Parekh
(74) *Attorney, Agent, or Firm* — Foley & Lardner LLP; Cliff Z. Liu

(57) ABSTRACT

A package structure includes a carrier defining a cavity in which a die is disposed. A dielectric material fills the cavity around the die. A first conductive layer is disposed over a first surface of the carrier. A first dielectric layer is disposed over an active surface of the die, the first conductive layer and the first surface of the carrier. A first conductive pattern is disposed over the first dielectric layer, and is electrically connected to the first conductive layer and to the active surface of the die. A second dielectric layer is disposed over the second surface of the carrier and defines a hole having a wall aligned with a sidewall of the cavity. A second conductive layer is disposed over the second dielectric layer. A third conductive layer is disposed on the sidewall of the cavity and the wall of the second dielectric layer.

21 Claims, 6 Drawing Sheets

(56) References Cited

U.S. PATENT DOCUMENTS

| | | | | |
|---|---|---|---|---|
| 8,693,209 B2* | 4/2014 | Mikado | ............... | H05K 1/185 |
| | | | | 174/250 |
| 2003/0141105 A1* | 7/2003 | Sugaya | ............... | H01L 21/56 |
| | | | | 174/256 |
| 2008/0163486 A1* | 7/2008 | Imamura | ............ | H05K 1/186 |
| | | | | 29/832 |
| 2008/0196932 A1* | 8/2008 | Sawatari | ........... | H01L 23/142 |
| | | | | 174/260 |
| 2009/0008793 A1* | 1/2009 | Pohl | ................. | H01L 21/568 |
| | | | | 257/777 |
| 2012/0319295 A1* | 12/2012 | Chi | ................... | H01L 21/561 |
| | | | | 257/774 |
| 2015/0342084 A1* | 11/2015 | Dorenkamp | ..... | H05K 7/2089 |
| | | | | 361/720 |

* cited by examiner

US 9,887,167 B1

EMBEDDED COMPONENT PACKAGE STRUCTURE AND METHOD OF MANUFACTURING THE SAME

BACKGROUND

1. Technical Field

The present disclosure relates to package structures and methods of manufacturing the same. In particular, the present disclosure relates to package structures with embedded components and methods of manufacturing such package structures.

2. Description of the Related Art

Semiconductor components have become more and more complex, driven at least in part by a demand for smaller components and enhanced performance.

Embedded technology may be considered a solution to achieve higher level integration with multi-functionalities and form factor shrinkage advantages. Traditionally, the act of embedding die has been burdened by factors such as dedicating a known good die to a poor yielding substrate build-up process, long cycle-time, and the difficulty to inspect, test and rework the embedded die structure.

SUMMARY

In one or more embodiments, a package structure includes a carrier defining a cavity in which a die is disposed. A dielectric material fills the cavity around the die. A first conductive layer is disposed over a first surface of the carrier. A first dielectric layer is disposed over an active surface of the die, the first conductive layer and the first surface of the carrier. A first conductive pattern is disposed over the first dielectric layer, and is electrically connected to the first conductive layer and to the active surface of the die. A second dielectric layer is disposed over the second surface of the carrier and defines a hole having a wall aligned with a sidewall of the cavity. A second conductive layer is disposed over the second dielectric layer. A third conductive layer is disposed on the sidewall of the cavity and the wall of the second dielectric layer.

In one or more embodiments, a package structure includes a carrier defining a cavity. A die is disposed in the cavity. The die has an active surface and a back surface opposite the active surface. The die includes contact pads on the active surface. A first conductive layer is disposed over the first surface of the carrier. A first dielectric layer is disposed over the active surface of the die, the first conductive layer and the first surface of the carrier. A first conductive pattern is disposed over the first dielectric layer, and the first conductive pattern electrically connects to the first conductive layer and to the active surface of the die. A second conductive layer is disposed over the second surface of the carrier. A third conductive layer is disposed on a sidewall of the cavity and electrically connects the first conductive layer to the second conductive layer. The first conductive pattern is electrically connected to the first conductive layer, the second conductive layer, and the third conductive layer.

In one or more embodiments, a method for manufacturing a package structure includes: providing a carrier; forming a first dielectric layer on a first surface of the carrier; forming a cavity extending from the first surface of the carrier to a second surface of the carrier; forming a conductive layer on the second surface of the carrier, on a sidewall of the cavity, and on the first dielectric layer; placing at least one die into the cavity, wherein the die has an active surface and a back surface opposite the active surface, the die including contact pads; filling the cavity with a dielectric material; forming a second dielectric layer on the second surface of the carrier; and forming a conductive pattern on the second dielectric layer, wherein the conductive pattern is electrically connected to the conductive layer and to the active surface of the die.

Other aspects and embodiments of the disclosure have also been contemplated. The summary and detailed descriptions are not meant to restrict the disclosure to any particular embodiment, but are merely meant to describe some embodiments of the disclosure.

DETAILED DESCRIPTION

There is a demand to reduce sizes of many electronic products, and thereby a demand to reduce sizes of included electronic components. One technique for manufacturing an electronic component in an electronic product includes placing a semiconductor device on a carrier (substrate) including electrical circuitry, such as a circuit board, and subsequently packaging the semiconductor device and the carrier to obtain the electronic component. By manufacturing the electronic component in this manner, however, a portion of the surface area of the carrier becomes occupied by the semiconductor device. To address this issue, in one or more embodiments of the present disclosure, a semiconductor device is embedded within a carrier such that more of the surface area of the carrier becomes available for other devices, and manufacturing becomes simplified. Furthermore, in one or more embodiments, a heat dissipation structure is provided for the semiconductor device. A resulting package structure allows for a reduction in a size of an associated electronic product.

In one or more embodiments of the present disclosure, a lead frame is used as a carrier to improve thermal performance. In another embodiment of the present disclosure, an organic material with thermal pad is used to improve the thermal performance. Thermal vias may also be added to improve the thermal performance. The thermal performance can be improved by exposing a surface of the die or plating thermal conductive material for heat dissipation.

Figure 1:
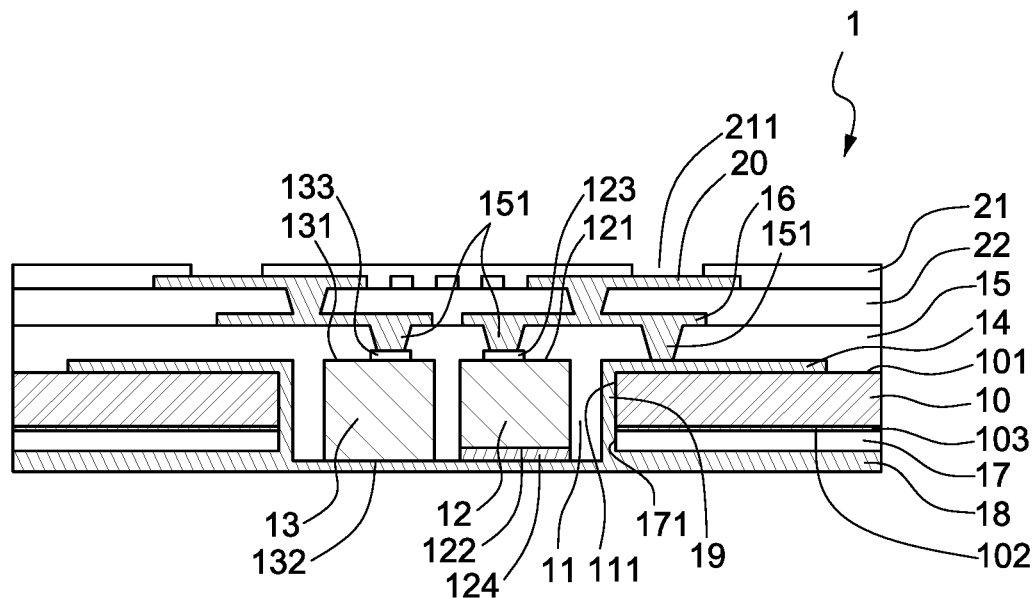
FIG. 1 is a cross-sectional view of a package structure according to an embodiment of the present disclosure.

FIG. 1 illustrates a cross-sectional view of a package structure 1 according to one or more embodiments of the present disclosure. The package structure 1 includes a carrier 10, a die 12, a die 13, a conductive layer 14, a dielectric layer 15, a conductive pattern 16, a dielectric layer 17, a conductive layer 18, a conductive layer 19, and a dielectric layer 22.

The carrier 10 has a first surface 101 and a second surface 102 that is opposite the first surface 101. A metal layer 103 is disposed on the second surface 102 of the carrier 10. The carrier 10 includes a cavity 11 extending from the first surface 101 of the carrier 10 to the second surface 102 of the carrier 10. The cavity 11 has a sidewall 111, and the cavity 11 is filled with a dielectric material. The cavity 11 may be of any suitable shape, such as columnar (e.g., cylindrical, elliptic columnar, square columnar, rectangular columnar, or other columnar shape) or non-columnar (e.g., conical, funnel-shaped, or other non-columnar shape), among other shapes. The sidewall 111 of the cavity 11 may be in the shape of an arc. The sidewall 111 of the cavity 11 may have a texture.

The carrier 10 may include a polymeric or a non-polymeric material. For example, a core substrate of the carrier 10 may include, without being limited to, C-stage resin materials, such as Ajinomoto build-up film (ABF), bismaleimide triazine (BT) resin, polyimide, or the like, or other suitable materials. In another example, a resin material used in the core substrate may be a fiber-reinforced resin so as to strengthen the core substrate, and the reinforcing fibers may be, without limitation to, glass fibers or Kevlar fibers (aramid fibers).

The dies 12 and 13 are disposed within the cavity 11. The die 12 has an active surface 121 and a back surface 122 that is opposite the active surface 121. The die 12 includes contact pads 123 on the active surface 121. Similarly, the die 13 has an active surface 131 and a back surface 132 that is opposite the active surface 131. The die 13 includes contact pads 133 on the active surface 131. A dimension of the cavity 11 is greater than a combined dimension of the dies 12 and 13 so as to contain the dies 12 and 13. A width and a shape of the cavity 11 can be designed to accommodate sizes and shapes of the dies 12 and 13. In one or more embodiments, there may be a single die (e.g., one of the dies 12 and 13), or more than two dies (e.g., the dies 12 and 13 and additional dies) in the cavity 11.

The conductive layer 14 is disposed over the first surface 101 of the carrier 10 and directly contacts the first surface 101 of the carrier 10.

The dielectric layer 15 is disposed over the active surfaces 121 and 131 of the respective dies 12 and 13, the conductive layer 14, and the surface 101 of the carrier 10. In one or more embodiments, the dielectric layer 15 may occupy and fill a space between the sidewall 111 of the cavity 11 of the carrier 10 and the die 12 or the die 13, and may further occupy and fill a space between the die 12 and the die 13.

The dielectric layer 15 may be, or may include, a polymeric or a non-polymeric dielectric material. For example, the dielectric layer 15 may include a flowable dielectric material in a hardened or semi-hardened state, such as a liquid crystal polymer, pre-impregnated composite fibers (e.g., prepreg), ABF, a resin, an epoxy compound, or other flowable dielectric material in a hardened or semi-hardened state. In one or more embodiments, the dielectric layer 15 includes a single resin layer. In other embodiments, the dielectric layer 15 includes multiple resin layers; for example, a first sub-layer formed of a resin and a second sub-layer formed of an enhanced resin (such as a resin enhanced by glass fibers or Kevlar fibers). In one or more embodiments, the dielectric layer 15 includes prepreg that may be in a single layer or multiple layers. In one or more embodiments, the dielectric layer 15 includes at least one prepreg layer and at least one resin layer.

The conductive pattern 16 is disposed over the dielectric layer 15. The conductive pattern 16 is electrically connected to the active surfaces 121 and 131 of the respective dies 12 and 13, and to the conductive layer 14.

In one or more embodiments, the dielectric layer 22 is disposed over the conductive pattern 16 and the dielectric layer 15. In one or more embodiments, a conductive pattern 20 is disposed over the dielectric layer 22. The conductive pattern 20 is electrically connected to contact pads 123 of the die 12 and the contact pads 133 of the die 13.

Multiple vias 151 are formed within the dielectric layer 15 to provide for electrical connections between the contact pads 123 or 133, the conductive pattern 16, the conductive layer 14, the conductive layer 18 and the conductive layer 19. Thus, the vias 151 electrically connect the contact pads 123 or 133 to the conductive layer 18, and further provide for a thermal dissipation path from the contact pads 123 or 133 to the conductive layer 18.

In one or more embodiments, the package structure 1 further includes a dielectric layer 21 disposed on the dielectric layer 22 and the conductive pattern 20. The dielectric layer 21 defines openings 211 exposing portions of the conductive pattern 20 for external electrical connection. The dielectric layer 21 may be, or may include, a photosensitive dry film or other patternable material, such as polyimide. In one or more embodiments, the dielectric layer 21 is a solder mask or a solder resist layer. The openings 211 may be of any suitable shape, such as columnar (e.g., cylindrical, elliptic columnar, square columnar, rectangular columnar, or other columnar shape) or non-columnar (e.g., conical, funnel-shaped, or other non-columnar shape), among other shapes. A side wall of the opening 211 may be in the shape of an arc. The side wall of the opening 211 may have a texture.

The dielectric layer 15 and the dielectric layer 22 may be made of a same material or a different material. In one or more embodiments in which the dielectric layer 15 and the dielectric layer 22 are made of the same material, the dielectric layer 15 and the dielectric layer 22 may join such that a boundary between the dielectric layer 15 and the dielectric layer 22 is not plainly evident. Although FIG. 1 illustrates a single layer for the dielectric layer 15 and a single layer for the dielectric layer 22, in one or more embodiments, one or both of the dielectric layer 15 and the dielectric layer 22 may include two or more layers.

The dielectric layer 17 covers the metal layer 103 of the carrier 10 and defines a hole having a wall 171, and the wall 171 is aligned with the sidewall 111 of the cavity 11.

The conductive layer 18 is disposed over the second dielectric layer 17. In one or more embodiments, the conductive layer 18 covers the hole of the dielectric layer 17. In one or more embodiments, the back surface 122 of the die 12 is attached to the conductive layer 18 with an adhesion material 124. In one or more embodiments, the adhesion material 124 is a thermally conductive adhesive that may include a thermally conductive silicone adhesive. In one or more embodiments, the back surface 132 of the die 13 is directly attached to the conductive layer 18.

The conductive layer 19 is disposed over the sidewall 111 of the cavity 11 and the wall 171 of the dielectric layer 17. The conductive layer 19 is electrically connected to the conductive layer 14 and the conductive layer 18. The conductive pattern 16 is electrically connected to the conductive layer 18 through the vias 151, the conductive layer 14 and the conductive layer 19. In one or more embodiments, the conductive layers 14, 18 and 19 may be formed integrally with one another, such as formed of a same material in one manufacturing stage.

Each of the conductive layer 14, the conductive layer 18, the conductive layer 19, the conductive pattern 16, the conductive pattern 20, and the vias 151 includes a conductive material such as a metal or metals, a metal alloy or alloys, a material with metal(s) and/or metal alloy(s) dispersed within, or a combination thereof. For example, each of the conductive layer 14, the conductive layer 18, the conductive layer 19, the conductive pattern 16, the conductive pattern 20, and the vias 151 may include aluminum, copper, titanium, or a combination thereof. Each of the conductive layer 14, the conductive layer 18, the conductive layer 19, the conductive pattern 16, the conductive pattern 20, and the vias 151 may include a different material. Alternatively, two or more of the conductive layer 14, the conductive layer 18, the conductive layer 19, the conductive pattern 16, the conductive pattern 20, and the vias 151 may be, or may include, a same material.

Heat generated by the dies 12 and 13 may be dissipated through the conductive layer 14, the conductive layer 18, the conductive layer 19, the conductive pattern 16, the conductive pattern 20, and the vias 151. Additionally or alternatively, the conductive layer 18 may be used to provide an electrical ground because the conductive layer 18 electrically connects to the die 12 through the conductive layer 14, the conductive layer 19, the conductive pattern 16, and the conductive pattern 20.

The conductive layer 19, the conductive pattern 16, and the conductive pattern 20 may function as a shield, to shield the dies 12 and/or 13 from electromagnetic influences, such as interference from signals from another embedded die or other electronic components, or influences from outside the package structure 1.

Using a thin lead-frame as the carrier 10, along with dielectric layers on each side of the carrier 10 (the dielectric layers 15 and 17), the package structure 1 can be relatively symmetrical with respect to the carrier 10 as compared to other structures, such that a warpage of the package structure 1 may be reduced. Moreover, the package structure 1 provides for a two-way thermal dissipation: one path through the backsides 122 and 132 of the respective dies 12 and 13 and another path through the thermal vias 151.

Embedding the dies 12 and 13 into the cavity 11 of the package structure 1 may provide at least the following advantages: (1) minimizing the warpage of the package structure 1 because the package structure 1 with embedded dies is more symmetrical than a package substrate with dies mounted thereon; (2) reducing an overall thickness of the package structure 1; and (3) filling the thermal vias 151 more easily as compared to vias extending through much of a package, because a depth of the thermal vias 151 is less.

Figure 2:
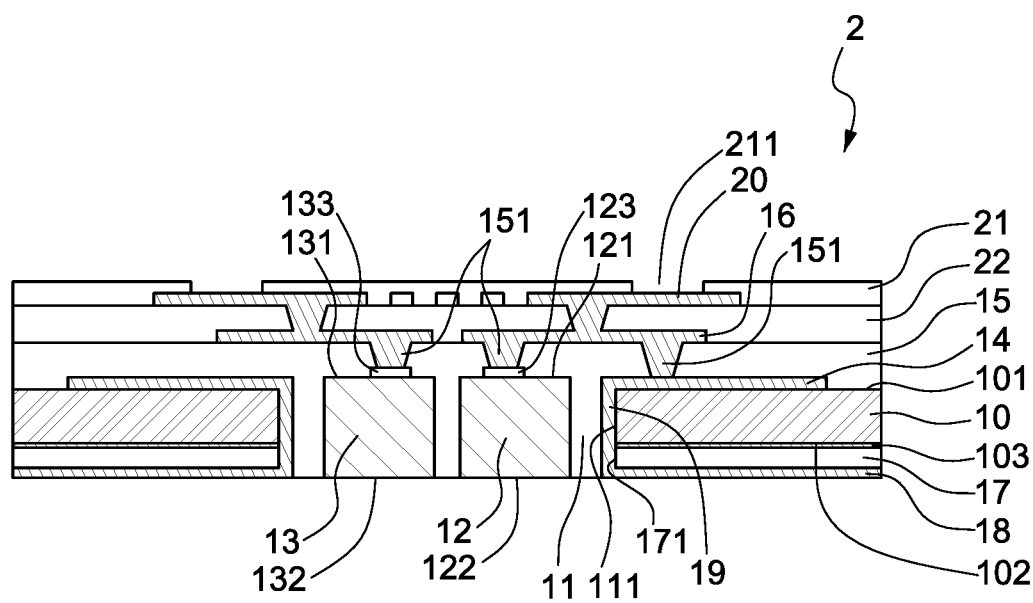
FIG. 2 is a cross-sectional view of a package structure according to another embodiment of the present disclosure.

FIG. 2 illustrates a cross-sectional view of a package structure 2 according to one or more embodiments of the present disclosure. The package structure 2 is similar to the package structure 1 in FIG. 1, with differences including that the back surfaces of the dies 12 and 13 are exposed in the cavity 11, without being covered by the conductive layer 18.

Figure 3:
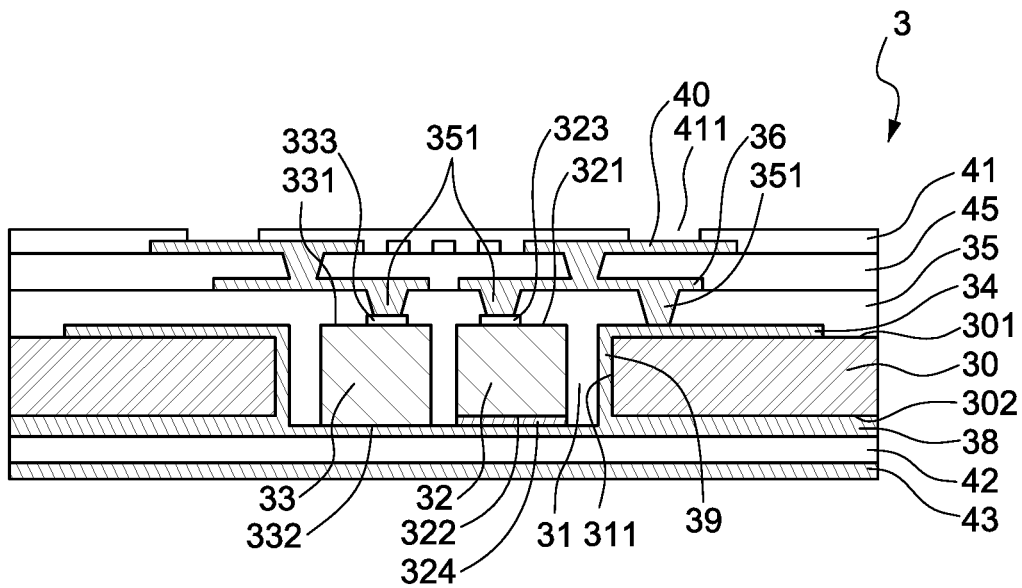
FIG. 3 is a cross-sectional view of a package structure according to another embodiment of the present disclosure.

FIG. 3 illustrates a cross-sectional view of a package structure 3 according to one or more embodiments of the present disclosure. The package structure 3 includes a carrier 30, a die 32, a die 33, a conductive layer 34, a dielectric layer 35, a conductive pattern 36, a dielectric layer 45, a conductive layer 38 and a conductive layer 39.

The carrier 30 has a first surface 301 and a second surface 302 opposite the first surface 301. The carrier 30 includes a cavity 31 extending from the first surface 301 of the carrier 30 to the second surface 302 of the carrier 30. The cavity 31 has a sidewall 311 and is filled with a dielectric material. The cavity 31 may be any suitable shape, such as columnar (e.g., cylindrical, elliptic columnar, square columnar, rectangular columnar, or other columnar shape) or non-columnar (e.g., conical, funnel-shaped, or other non-columnar shape), among other shapes. The sidewall 311 of the cavity 31 may be in the shape of an arc. The sidewall 311 of the cavity 31 may have a texture.

The carrier 30 may include a polymeric or a non-polymeric material. For example, a core substrate of the carrier 30 may include, without being limited to, C-stage resin materials, such as ABF, BT resin, polyimide, or the like, or other suitable materials. In another example, a resin material used in the core substrate may be a fiber-reinforced resin so as to strengthen the core substrate, and the reinforcing fibers may be, without limitation to, glass fibers or Kevlar fibers.

The dies 32 and 33 are disposed in the cavity 31. The die 32 has an active surface 321 and a back surface 322 opposite the active surface 321. The die 32 includes contact pads 323 on the active surface 321. Similarly, the die 33 has an active surface 331 and a back surface 332 opposite the active surface 331. The die 33 includes contact pads 333 on the active surface 331. A dimension of the cavity 31 is greater than a combined dimension of the dies 32 and 33 so as to contain the dies 32 and 33. A width and a shape of the cavity 31 can be designed to accommodate sizes and shapes of the dies 32 and 33. In one or more embodiments, there may be a single die (e.g., one of the dies 32 and 33), or more than two dies (e.g., the dies 32 and 33 and additional dies) in the cavity 31.

The conductive layer 34 is disposed over the first surface 301 of the carrier 30 and directly contacts the first surface 301 of the carrier 30.

The dielectric layer 35 covers the active surfaces 321 and 331 of the respective dies 32 and 33, the conductive layer 14 and the first surface 301 of the carrier 30. The conductive pattern 36 is disposed over the dielectric layer 35 and is electrically connected to the active surfaces 321 and 331 of the respective dies 32 and 33 and to the conductive layer 34. In one or more embodiments, the dielectric layer 35 may occupy and fill a space between the sidewall 311 of the cavity 31 of the carrier 30 and the die 32 or the die 33, and may further occupy and fill a space between the die 32 and the die 33.

The dielectric layer 35 may be, or may include, a polymeric or a non-polymeric dielectric material. For example, the dielectric layer 35 may include a flowable dielectric material in a hardened or semi-hardened state, such as a liquid crystal polymer, pre-impregnated composite fibers (e.g., prepreg), ABF, a resin, an epoxy compound, or other flowable dielectric material in a hardened or semi-hardened state. In one or more embodiments, the dielectric layer 35 includes a single resin layer. In other embodiments, the dielectric layer 35 includes multiple resin layers; for example, a first sub-layer formed of a resin and a second sub-layer formed of an enhanced resin (such as a resin enhanced by glass fibers or Kevlar fibers). In one or more embodiments, the dielectric layer 35 includes prepreg that may be in a single layer or multiple layers. In one or more embodiments, the dielectric layer 35 includes at least one prepreg layer and at least one resin layer.

The dielectric layer 45 covers the conductive pattern 36 and the dielectric layer 35. A conductive pattern 40 is disposed over the dielectric layer 45, and is electrically connected to the contact pads 323 of the die 32 and the contact pads 333 of the die 33.

Multiple vias 351 are formed within the dielectric layer 35 for electrical connections between the contact pads 323 or 333, the conductive pattern 36, the conductive layer 34, the conductive layer 38 and the conductive layer 39, so that a thermal dissipation path is formed from the contact pads 323 or 333 to the conductive layer 38.

In one or more embodiments, the package structure 3 further includes a dielectric layer 41 disposed on the dielectric layer 45 and the conductive pattern 40. The dielectric layer 41 defines openings 411 exposing portions of the conductive pattern 40 for external electrical connection. The dielectric layer 41 may be, or may include, a photosensitive dry film or other patternable material, such as polyimide. In one or more embodiments, the dielectric layer 41 is a solder mask or a solder resist layer. The openings 411 may be of any suitable shape, such as columnar (e.g., cylindrical, elliptic columnar, square columnar, rectangular columnar, or other columnar shape) or non-columnar (e.g., conical, funnel-shaped, or other non-columnar shape), among other shapes. A side wall of an opening 411 may be in the shape of an arc. The side wall of the opening 411 may have a texture.

The dielectric layer 35 and the dielectric layer 45 may be made of a same material or different materials. In one or more embodiments in which the dielectric layer 35 and the dielectric layer 45 are made of the same material, the dielectric layer 35 and the dielectric layer 45 may join such that a boundary between the dielectric layer 35 and the dielectric layer 45 is not plainly evident. Although FIG. 3 illustrates a single layer for the dielectric layer 35 and a single layer for the dielectric layer 45, in one or more embodiments, one or both of the dielectric layer 35 and the dielectric layer 45 may include two or more layers.

The conductive layer 38 is disposed over the second surface 302 of the carrier 30. The conductive layer 39 is disposed over the sidewall 311 of the cavity 31 and electrically connects to the conductive layer 34 and the conductive layer 38. The conductive pattern 36 is electrically connected to the conductive layer 38 through the vias 351, the conductive layer 34 and the conductive layer 39. In one or more embodiments, the conductive layer 38 extends through the cavity 31 to form the conductive layer 39. In one or more embodiments, the back surface 322 of the die 32 is attached to the conductive layer 38 with an adhesion material 324. In one or more embodiments, the adhesion material 324 is a thermally conductive adhesive, which may include a thermally conductive silicone adhesive. In one or more embodiments, the back surface 332 of the die 33 is directly attached to the conductive layer 38. In one or more embodiments, a dielectric layer 42 is disposed over the conductive layer 38 and a conductive layer 43 is disposed over the dielectric layer 42.

Each of the conductive layer 34, the conductive layer 38, the conductive layer 39, the conductive pattern 36, the conductive pattern 40 and the vias 351 includes a conductive material such as a metal or metals, a metal alloy or alloys, a material with metal(s) and/or metal alloy(s) dispersed within, or a combination thereof. For example, each of conductive layer 34, the conductive layer 38, the conductive layer 39, the conductive pattern 36, the conductive pattern 40 and the vias 351 may include aluminum, copper, titanium or a combination thereof. Each of the conductive layer 34, the conductive layer 38, the conductive layer 39, the conductive pattern 36, the conductive pattern 40 and the vias 351 may be, or may include, a different material. Alternatively, two or more of the conductive layer 14, the conductive layer 18, the conductive layer 19, the conductive pattern 16, the conductive pattern 20, and the vias 151 may be, or may include, a same material.

The conductive layer 39, the conductive pattern 36 and the conductive pattern 40 may function as a shield, to shield the dies 32 and/or 33 from electromagnetic influences such as, for example, interference due to signals from another embedded die or other electronic components, or influences from outside the package structure 3.

Figure 4:
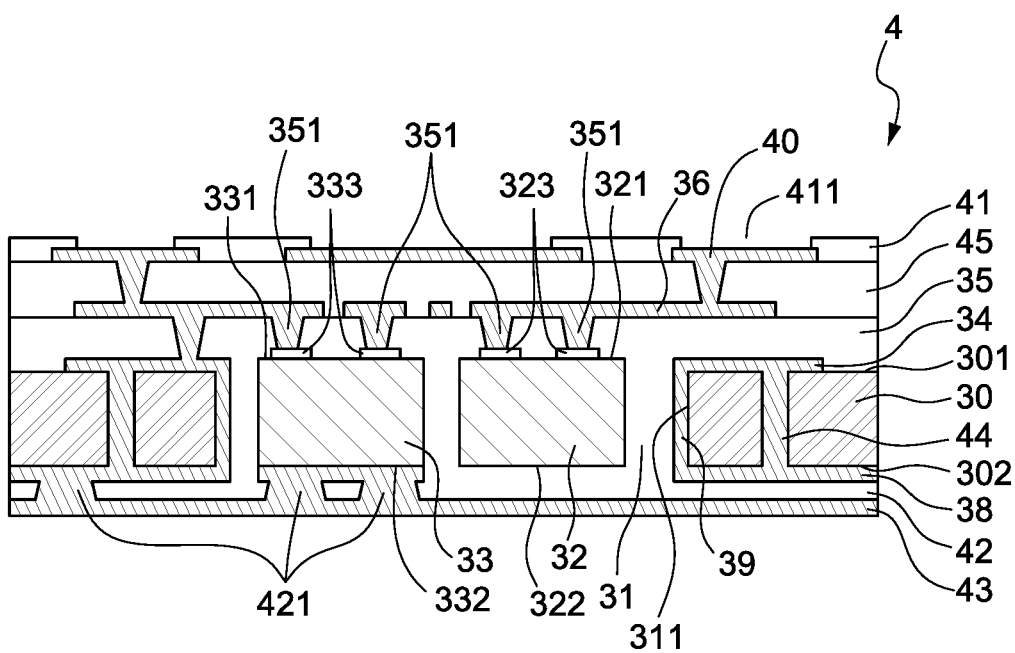
FIG. 4 is a cross-sectional view of a package structure according to another embodiment of the present disclosure.

FIG. 4 illustrates a cross-sectional view of a package structure 4 according to one or more embodiments of the present disclosure. The package structure 4 is similar to the package structure 3 in FIG. 3, with differences including that the conductive layer 38 extends through the cavity 31 and multiple vias 421 are formed within the dielectric layer 42. The vias 421 connect the conductive layer 38 and the conductive layer 43. In one or more embodiments, a thickness (e.g., a dimension in the vertical direction in the orientation shown) of the vias 351 is greater than a thickness of the vias 421. In one or more embodiments, a conductive through hole 44 is formed within the carrier 30. The conductive through hole 44 extends from the first surface 301 of the carrier 30 to the second surface 302 of the carrier 30, and electrically connects the conductive layer 34 and the conductive layer 38. The conductive through hole 44 may provide another thermal dissipation path between the conductive layer 34 and the conductive layer 38.

Figure 5:
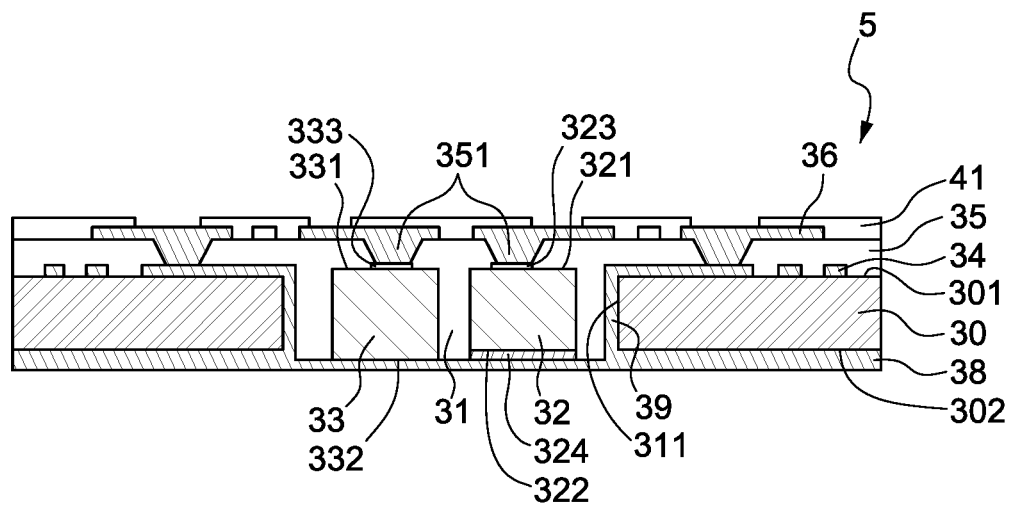
FIG. 5 is a cross-sectional view of a package structure according to another embodiment of the present disclosure.

FIG. 5 illustrates a cross-sectional view of a package structure 5 according to one or more embodiments of the present disclosure. The package structure 5 is similar to the package structure 3 in FIG. 3, with differences including that the dielectric layer 42 and the conductive layer 43 of FIG. 3 are omitted such that the conductive layer 38 is exposed. In one or more embodiments, the back surface 322 of the die 32 is attached to the conductive layer 38 with an adhesion material 324. In one or more embodiments, the back surface 332 of the die 33 is directly attached to the conductive layer 38.

Figure 6:
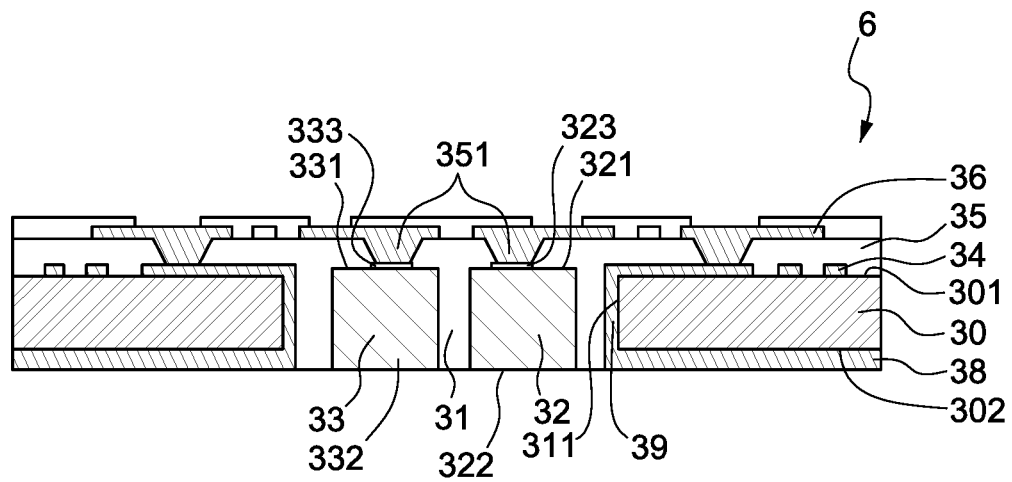
FIG. 6 is a cross-sectional view of a package structure according to another embodiment of the present disclosure.

FIG. 6 illustrates a cross-sectional view of a package structure 6 according to one or more embodiments of the present disclosure. The package structure 6 is similar to the package structure 5 in FIG. 5, with differences including that the back surfaces 322 and 323 of the respective dies 32 and 33 are exposed in the cavity 31 of the carrier 30. The back surfaces 322 and 323 of the respective dies 32 and 33 are co-planar with a lower surface of the conductive layer 38.

FIGS. 7A, 7B, 7C, 7D, 7E and 7F illustrate methods for manufacturing an embedded component package structure according to embodiments of the present disclosure. In one or more embodiments, the methods may also be used to form an embedded component package structure corresponding to one of the embodiments in FIGS. 1-6.

Figure 7A:
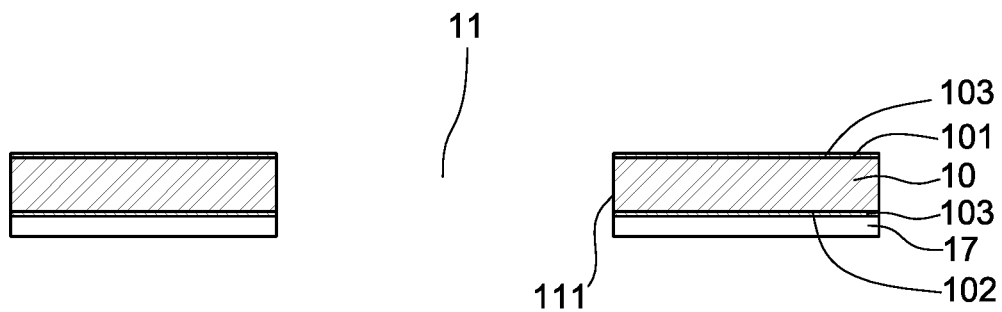
FIG. 7A, FIG. 7B, FIG. 7C, FIG. 7D, FIG. 7E and FIG. 7F illustrate methods for manufacturing an embedded component package structure according to embodiments of the present disclosure.

Referring to FIG. 7A, a carrier 10 having a first surface 101 and a second surface 102 is provided, wherein a metal layer 103 is provided on the first surface 101 and on the second surface 102 of the carrier 10. A dielectric layer 17 is formed on the second surface 102 of the carrier 10. A cavity 11 extending from the first surface 101 of the carrier 10 to the second surface 102 of the carrier 10 is formed. The cavity 11 has a sidewall 111.

Figure 7B:
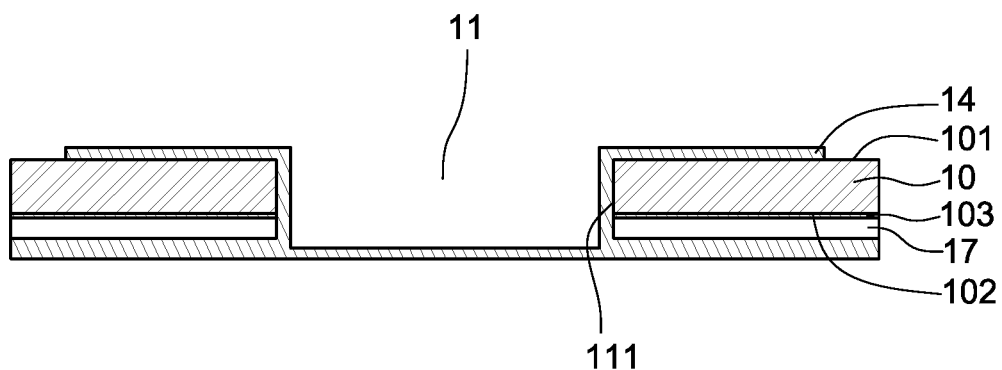

Referring to FIG. 7B, a conductive layer 14 is formed on the first surface 101 of the carrier 10, the sidewall 111 of the cavity 11 and the dielectric layer 17. The conductive layer 14 extends across the cavity 11 to form a bottom surface of the cavity 11.

Figure 7C:
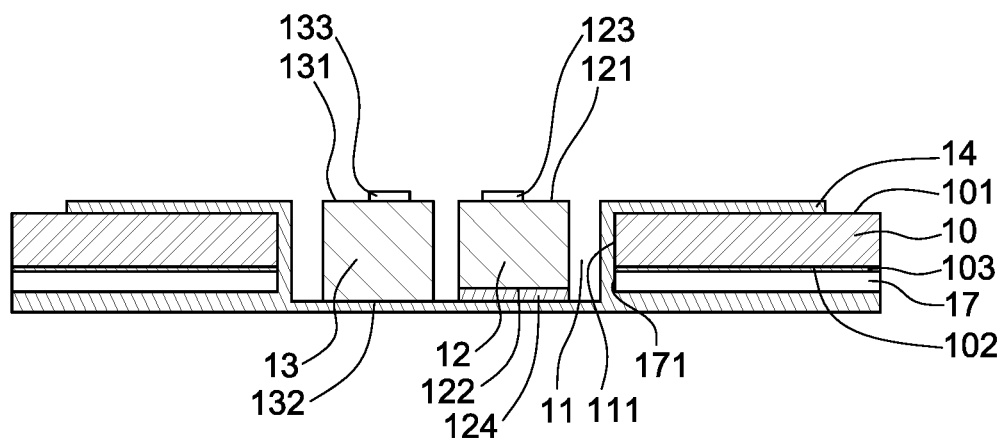

Referring to FIG. 7C, a die 12 and a die 13 are placed into the cavity 11. The die 12 has an active surface 121 and a back surface 122 opposite the active surface 121. The die 12 includes contact pads 123 on the active surface 121. Similarly, the die 13 has an active surface 131 and a back surface 132 opposite the active surface 131. The die 13 includes contact pads 133 on the active surface 131. In one or more embodiments, the back surface 122 of the die 12 is attached to the conductive layer 14 in the cavity 11 with an adhesion material 124. In one or more embodiments, the adhesion material 124 is a thermally conductive adhesive, which may include a thermally conductive silicone adhesive. In one or more embodiments, the back surface 132 of the die 13 is directly attached to the conductive layer 14.

Figure 7D:
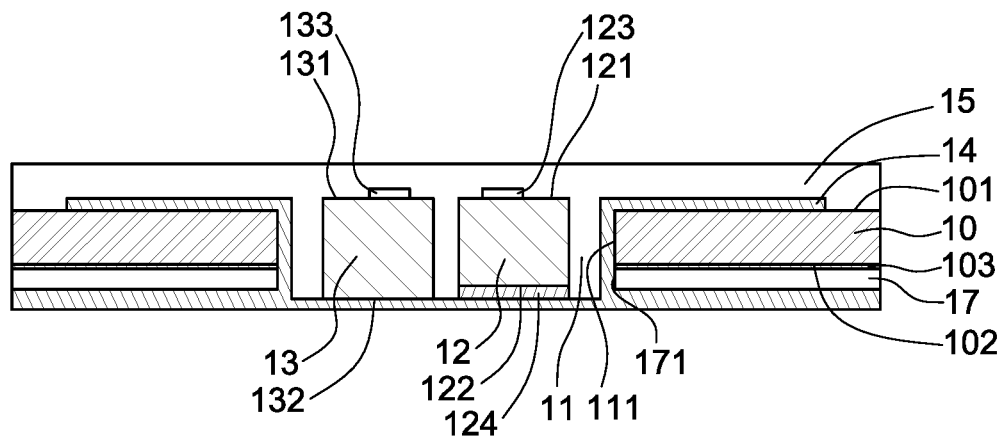

Referring to FIG. 7D, the cavity 11 is filled with a dielectric material, and a dielectric layer 15 is formed on the surface 101 of the carrier 10. In one embodiment, the dielectric layer 15 is pressed into the cavity 11 to fill the cavity 11.

Figure 7E:
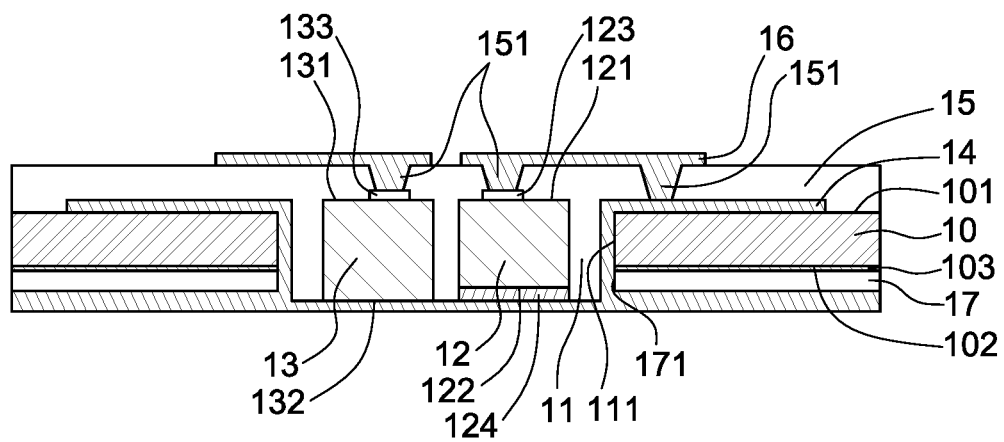

Referring to FIG. 7E, a conductive pattern 16 is formed on the dielectric layer 15. Vias 151 are formed within the dielectric layer 15. The conductive pattern 16 is electrically connected to the conductive layer 14, the active surface 121 of the die 12 and the active surface 131 of the die 13 through the vias 151.

Figure 7F:
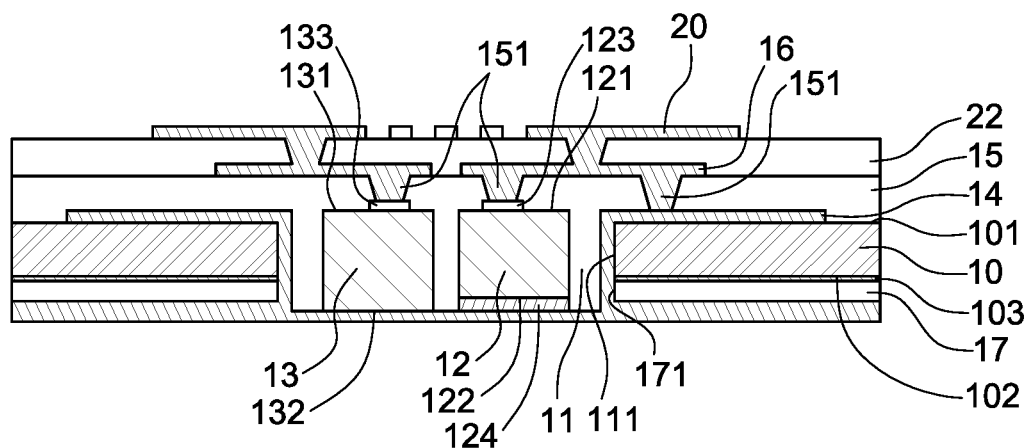

Referring to FIG. 7F, a dielectric layer 22 is formed on the conductive pattern 16 and the dielectric layer 15. A conductive pattern 20 is formed on the dielectric layer 22. The conductive pattern 20 is electrically connected to the contact pads 123 of the die 12 and the contact pads 133 of the die 13.

Subsequent to forming the conductive pattern 20, an additional dielectric layer (e.g., a dielectric layer 21) may be formed on the dielectric layer 22 and the conductive pattern 20 to form the package structure 1 as shown in FIG. 1.

As used herein, the term "warpage" refers to deformation of the structure of a substrate which reduces a planarity of one or more surfaces of the substrate. Magnitude of the warpage may be determined by a distance between a lowest point of a deformation of the substrate to a highest point of the deformation. Each substrate may have a different degree of warpage resulting from a change from room temperature (e.g., 25° C.) to reflow temperature (e.g., 260° C.), or from reflow temperature to room temperature. Further, warpage may occur while the semiconductor substrate stays at a steady temperature, due to a mismatch in coefficients of thermal expansion (CTE) between different components of the substrate. In other words, two sides of the substrate may be subject to different degrees of thermal expansion, resulting in stress effects that cause warpage. Additionally, as the overall thickness of the semiconductor structure decreases, warpage in a semiconductor structure is more pronounced. Therefore, a solution for preventing warpage such as described in the present disclosure may be beneficial to the semiconductor industry.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:
1. A package structure, comprising:
 a carrier having a first surface and a second surface opposite the first surface, the carrier defining a cavity extending from the first surface to the second surface;
 at least one die disposed in the cavity, the die having one or more side surfaces, an active surface and a back surface opposite the active surface, wherein the die comprises a plurality of contact pads on the active surface;
 a dielectric material filling the cavity around the one or more side surfaces and over the active surface of the die;
 a first conductive layer disposed over the first surface of the carrier;
 a first dielectric layer disposed over the active surface of the die, and further disposed over the first conductive layer and the first surface of the carrier;
 a first conductive pattern disposed over the first dielectric layer, the first conductive pattern electrically connected to the first conductive layer and to the active surface of the die;
 a second dielectric layer disposed over the second surface of the carrier and defining a hole, wherein the hole has a wall aligned with a sidewall of the cavity;
 a second conductive layer disposed over the second dielectric layer; and
 a third conductive layer disposed over the sidewall of the cavity and the wall of the second dielectric layer, the third conductive layer electrically connecting the first conductive layer and the second conductive layer;

wherein the first conductive pattern is electrically connected to the first conductive layer, the second conductive layer, and the third conductive layer.

2. The package structure of claim 1, further comprising a plurality of vias formed within the first dielectric layer, wherein the vias electrically connect the contact pads to the first conductive pattern, the first conductive layer, the second conductive layer and third conductive layer, and wherein the vias, the first conductive pattern, the first conductive layer, and the third conductive layer form a thermal dissipation path from the contact pads to the second conductive layer.

3. The package structure of claim 2, further comprising a third dielectric layer disposed over the first dielectric layer and a second conductive pattern disposed over the third dielectric layer, wherein the second conductive pattern is electrically connected to the contact pads.

4. The package structure of claim 1, wherein the die is exposed from the cavity.

5. The package structure of claim 1, further comprising an adhesion material, wherein the back surface of the die is attached to the second conductive layer with the adhesion material.

6. The package structure of claim 1, wherein the back surface of the die directly contacts the second conductive layer.

7. A package structure, comprising:
a carrier having a first surface and a second surface opposite the first surface, the carrier defining a cavity extending from the first surface to the second surface;
at least one die disposed in the cavity, the die having an active surface and a back surface opposite the active surface, the die comprising a plurality of contact pads on the active surface, wherein no contact pads of the die are on the back surface of the die;
a first conductive layer disposed over the first surface of the carrier;
a first dielectric layer disposed over the active surface of the die, the first dielectric layer further disposed over the first conductive layer and the first surface of the carrier;
a first conductive pattern disposed over the first dielectric layer, the first conductive pattern electrically connected to the first conductive layer and to the active surface of the die;
a second conductive layer disposed over the second surface of the carrier; and
a third conductive layer disposed over a sidewall of the cavity and electrically connecting the first conductive layer to the second conductive layer;
wherein the first conductive pattern is electrically connected to the first conductive layer, the second conductive layer, and the third conductive layer.

8. The package structure of claim 7, further comprising a plurality of vias formed within the first dielectric layer and electrically connecting the contact pads to the first conductive pattern, the first conductive layer, the second conductive layer, and the third conductive layer, wherein the vias, the first conductive pattern, the first conductive layer, and the third conductive layer form a thermal dissipation path from the contact pads to the second conductive layer.

9. The package structure of claim 7, further comprising a second dielectric layer disposed over the second conductive layer, and a fourth conductive layer disposed over the second dielectric layer.

10. The package structure of claim 9, further comprising a plurality of first vias formed within the first dielectric layer and a plurality of second vias formed within the second dielectric layer, wherein a thickness of the plurality of first vias is greater than a thickness of the plurality of second vias.

11. The package structure of claim 10, wherein at least one of the plurality of second vias electrically connects the second conductive layer to the fourth conductive layer.

12. The package structure of claim 10, wherein at least one of the plurality of second vias electrically connects the back surface of the die to the fourth conductive layer.

13. The package structure of claim 7, further comprising a conductive through hole formed within the carrier, wherein the conductive through hole extends from the first surface of the carrier to the second surface of the carrier, and the conductive through hole electrically connects the first conductive layer and the second conductive layer.

14. The package structure of claim 7, further comprising an adhesion material, wherein the back surface of the die is attached to the second conductive layer with the adhesion material.

15. The package structure of claim 7, wherein the back surface of the die is exposed from the cavity.

16. The package structure of claim 7, further comprising a second dielectric layer disposed over the first dielectric layer and a second conductive pattern disposed over the second dielectric layer, wherein the second conductive pattern is electrically connected to the contact pads of the die.

17. The package structure of claim 7, wherein the die is exposed from the cavity.

18. The package structure of claim 7, further comprising an adhesion material, wherein the back surface of the die is attached to the second conductive layer with the adhesion material.

19. The package structure of claim 7, wherein the second conductive layer and the first conductive pattern form an electromagnetic shield configured to shield the at least one die from electromagnetic interference.

20. The package structure of claim 7, wherein a dimension of the cavity is greater than a dimension of the at least one die.

21. A package structure, comprising:
a carrier having a first surface and a second surface opposite the first surface, the carrier defining a cavity extending from the first surface to the second surface;
at least one die disposed in the cavity, the die having an active surface and a back surface opposite the active surface, the die comprising a plurality of contact pads on the active surface;
a first conductive layer disposed over the first surface of the carrier;
a first dielectric layer disposed over the active surface of the die, the first dielectric layer further disposed over the first conductive layer and the first surface of the carrier;
a first conductive pattern disposed over the first dielectric layer, the first conductive pattern electrically connected to the first conductive layer and to the active surface of the die;
a second conductive layer disposed over the second surface of the carrier;
a third conductive layer disposed over a sidewall of the cavity and electrically connecting the first conductive layer to the second conductive layer; and
a second dielectric layer disposed over the second conductive layer and a fourth conductive layer disposed over the second dielectric layer, wherein the back surface of the die directly contacts the second conductive layer;

wherein the first conductive pattern is electrically connected to the first conductive layer, the second conductive layer, and the third conductive layer.

* * * * *